United States Patent [19]

Vincelette et al.

[11] Patent Number: 5,412,387
[45] Date of Patent: May 2, 1995

[54] ERROR REDUCTION IN SWITCHED CAPACITOR DIGITAL-TO-ANALOG CONVERTER SYSTEMS BY BALANCED SAMPLING

[75] Inventors: Scott Vincelette, Glenmoore, Pa.; Paul F. Ferguson, Jr., Dracut; Robert W. Adams, Acton, both of Mass.

[73] Assignee: Analog Devices, Inc., Norwood, Mass.

[21] Appl. No.: 44,370

[22] Filed: Apr. 6, 1993

[51] Int. Cl.6 .............................................. H03M 1/66
[52] U.S. Cl. .................................. 341/150; 341/143; 341/172
[58] Field of Search ............... 341/110, 122, 123, 143, 341/150, 172

[56] References Cited

U.S. PATENT DOCUMENTS 5,248,970  9/1993  Sooch et al. .................... 341/120
5,323,158  6/1994  Ferguson, Jr. .................. 341/143

Primary Examiner—Howard L. Williams
Attorney, Agent, or Firm—Wolf, Greenfield & Sacks

[57] ABSTRACT

A switched-capacitor DAC system includes two switched-capacitor DACs and a load circuit. The switched-capacitor filter of the first DAC samples a reference voltage source, which produces a reference voltage, at a first rate and the switched-capacitor filter of the second DAC samples the reference voltage source at a second rate, greater than the first rate. The load circuit samples the reference voltage source at a rate such that the level of the reference voltage is the same each time a sample is taken. The load circuit effectively equates the sampling of the two filters and substantially eliminates problems related to gain errors and low frequency quantization noise.

15 Claims, 6 Drawing Sheets

ERROR REDUCTION IN SWITCHED CAPACITOR DIGITAL-TO-ANALOG CONVERTER SYSTEMS BY BALANCED SAMPLING

FIELD OF THE INVENTION

The present invention relates to digital-to-analog converter (hereinafter "DAC") systems and, more particularly, to an apparatus and method for reducing errors associated with operating two synchronous switched-capacitor DACs at different rates.

BACKGROUND OF THE INVENTION

In the fields of digital audio and telecommunications, among others, it has become increasingly desirable, in converting from digital to analog signals and analog to digital signals, to produce signals of low distortion and noise. Many systems which implement both DACs and analog-to-digital converters (hereinafter "ADCs") commonly perform "digital oversampling" and "analog oversampling", respectively. Digital oversampling is a technique by which there is provided from a digital input signal of a first rate, a corresponding second digital signal of a second rate which is significantly greater than the first rate. By contrast, analog oversampling is a technique by which an analog signal is sampled at greater than its Nyquist rate.

Additionally, many such systems employ sigma-delta modulators. Sigma-delta modulation is a process used, in part, to manipulate the noise spectrum of an input signal so that most of the noise power ("quantization noise") therein is moved to frequencies substantially outside the signal bandwidth. This is referred to as "noise shaping". A filter typically reduces the out of band shaped quantization noise to acceptable levels for handling by external components, such as loudspeakers.

The filter used to reduce the out of band quantization noise is generally a switched-capacitor filter. Switched-capacitor filters employ a network of capacitors and switches to "sample" periodically a reference voltage source, which provides a reference voltage. The "sampling" includes periodically charging one or more capacitors from the reference voltage source. This operation is also referred to as "charge loading".

In a system, such as a mixed-signal integrated circuit, which includes both switched-capacitor DAC and ADC circuits, two DACs are typically synchronously operated from the same system clock; one DAC is the primary DAC in the DAC circuit ("the main DAC") and the other DAC ("the secondary DAC") is connected in the feedback path of the ADC circuit. Problems are encountered when the two synchronous switched-capacitor DACs are operated at different rates. This situation occurs when the main DAC includes control circuitry for altering the clock frequency at which the DAC modulator operates without simultaneously altering the clock frequency of the ADC circuitry by the same value. This situation can also occur if digital input signals of varying rates are input to the main DAC and the rate at which the ADC system operates is independent of the rates of the digital input signals. The application of the same assignee, titled A METHOD FOR VARYING THE INTERPOLATION RATIO OF A DIGITAL OVERSAMPLING DIGITAL-TO-ANALOG CONVERTER SYSTEM AND APPARATUS THEREFOR, filed on even date herewith as Ser. No. 08/043,408 now U.S. Pat. No. 5,313,205, which is hereby incorporated by reference herein, discloses an apparatus and method for controlling the interpolation ratio of an oversampled DAC such that signal quantization noise is shaped substantially outside of the signal bandwidth. Upon a decrease in the input sampling frequency, the interpolation ratio is increased. A corresponding increase in the ADC circuitry (i.e., decimator) does not take place. Thus, in such a system, the two DACS (that is, the filters of the two DACs) operate at different rates when the input sampling frequency is changed.

One problem associated with this situation is that gain errors in the DAC outputs will occur. This is so because the mismatch in the sample rates of the DACs will present a varying load to the reference voltage source. This variation will, in turn, change the effective value of the reference voltage "seen" by the main DAC (which is operating at a different, generally higher rate).

Additionally, a more serious problem results, relating to a shift in the noise spectrum. In particular, because the switched-capacitor filter of the main DAC is operating at a faster rate than the switched-capacitor filter of the secondary DAC, charge sampling of the reference voltage source is occurring at two different rates. The charge sampling output of the faster DAC will be modulated and, in the case of a sigma-delta DAC, "inter-modulation" of the shaped quantization noise will occur. This inter-modulation shifts the quantization noise spectrum into a lower frequency band (in certain applications, within the bandwidth of the signal being processed). This result is highly undesirable and can cause high in-band noise and deterious unwanted idle tones.

SUMMARY OF THE INVENTION

The aforementioned problems and conditions are overcome, or avoided, by a method and apparatus in which the charge loading of the two switched-capacitor DACs is equalized, even when the DACs are running at different rates.

More particularly, according to the invention, a DAC system includes a first DAC which is coupled to and samples a reference voltage source, which provides a reference voltage, at a first rate, and a second DAC which is coupled to and samples the reference voltage source at a second rate. A load circuit is coupled to and samples the reference voltage source at a third rate such that the level of the reference voltage is substantially the same each time a sample is taken.

In a preferred embodiment, the reference voltage source is a capacitive, rather than a zero or low-impedance, voltage source which produces a reacitve reference voltage output. The load circuit includes a network of switches and capcitors which periodically draw charge from the reference voltage source. A control circuit is coupled to the network and produces control signals which control the period of the sampling.

Other advantages, novel features and objects of the invention will become apparent from the following detailed description of an example of the invention when considered in conjunction with the accompanying drawings.

DETAILED DESCRIPTION

Figure 1:
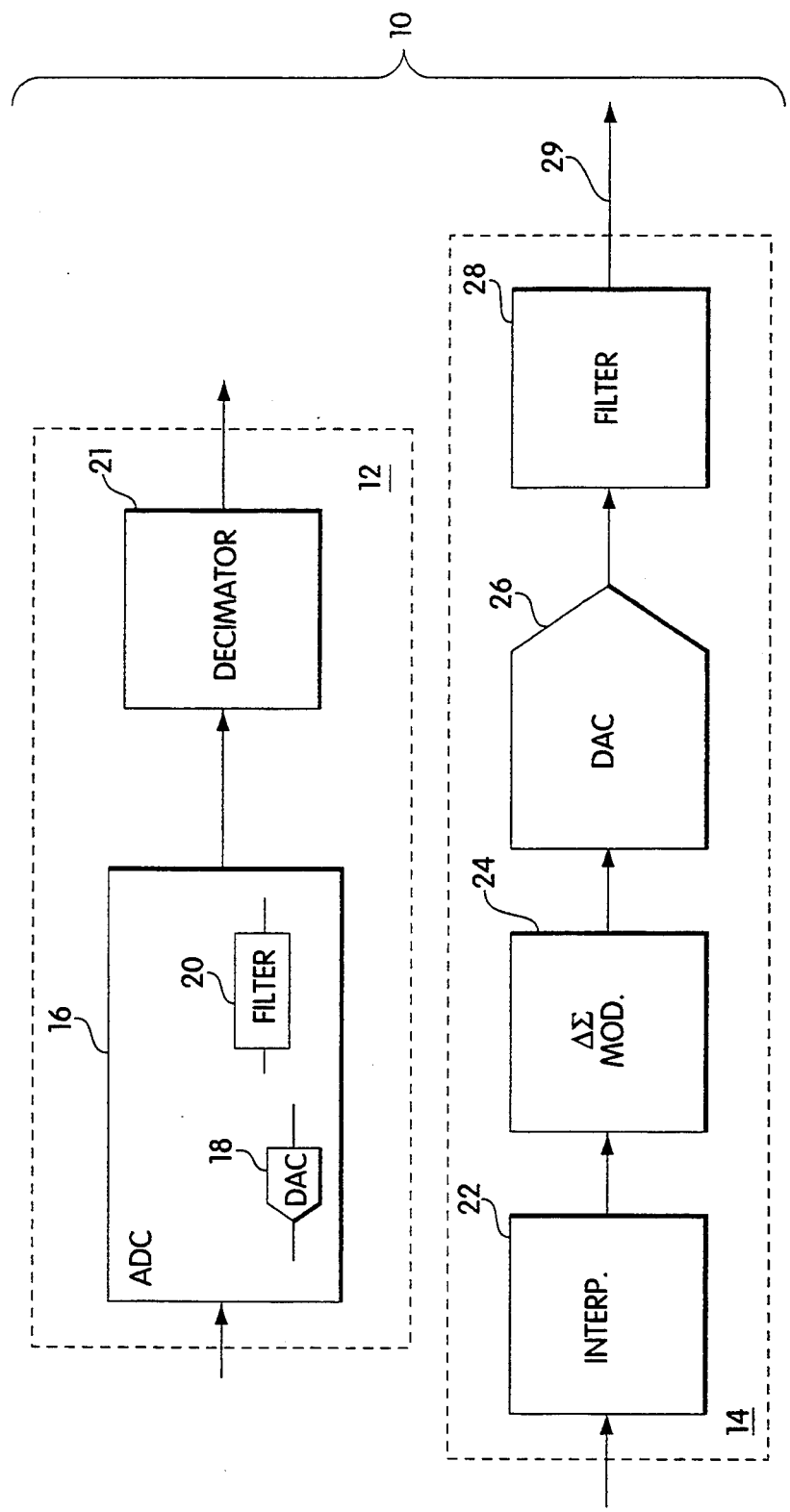
FIG. 1 is a block diagram of a prior art switched-capacitor system employing both a DAC and an ADC.

Referring to FIG. 1, a prior art system 10 is shown including both a switched-capacitor sigma-delta ADC ciruit 12 and DAC circuit 14. Conventional mixed-signal integrated circuit systems, such as CODECs, generally combine ADC, DAC and DSP (digital signal processing) circuits on a single chip. System 10 of FIG. 1 shows the DAC and ADC circuit portions of such a system.

The ADC circuit 12 includes a sigma-delta ADC 16, including a DAC 18 and switched-capacitor filter 20 in a feedback path thereof, and a decimator 21. The ADC 16 performs analog oversampling on an analog input voltage, outputting a noise-shaped oversampled digital signal. The decimator 20 operates to reduce high frequency quantization noise.

DAC circuit 14 includes interpolator 22, sigma-delta modulator 24, DAC 26, and switched-capacitor filter 28. The interpolator 22 performs digital oversampling on a digital input signal and provides the oversampled signal to the sigma-delta modulator 24 which performs noise shaping on that signal. The noise-shaped signal is then converted to an analog signal by DAC 26 and the switched-capacitor filter 28 reduces high frequency quantization noise found on the output of DAC 26, to yield a "clean" signal at output 29.

The DACs 18 and 26 operate synchronously, from the same system clock. When the DACs 18 and 26 are operating at different clock rates, the switched-capacitor filters 20 and 28 sample the reference voltage source at different rates. In particular, when DAC 26 is operating at a rate greater than DAC 18, switched-capacitor filter 28 is sampling the reference voltage source at a greater rate than switched-capacitor filter 20.

Figure 2:
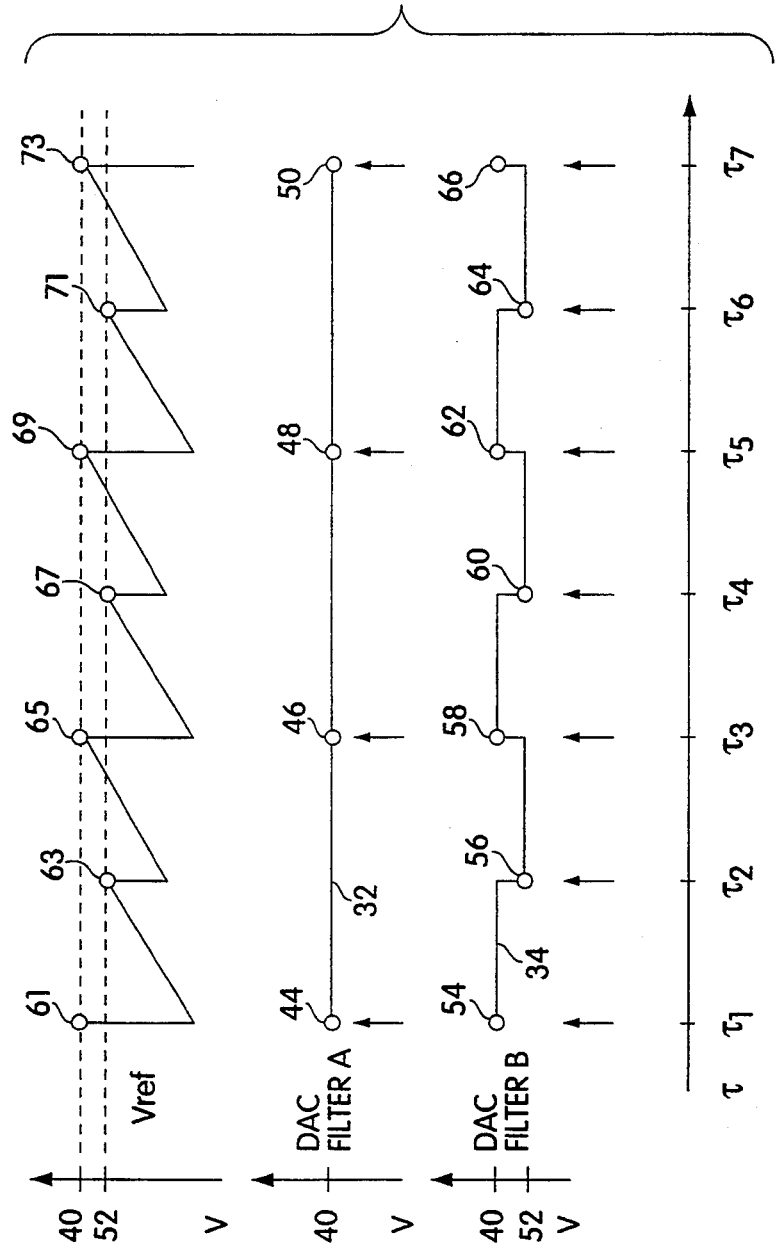
FIG. 2 is a timing diagram of a prior art synchronous switched-capacitor DAC system.

FIG. 2 shows a timing diagram (amplitude verses time) of the reference voltage Vref, and the sampled outputs of both switched-capacitor filters. When a switched-capacitor filter samples charge from the reference voltage source (which itself has a capacitive output circuit), it instantaneously disturbs the value of the reference voltage. If the reference voltage has a low enough bandwidth, then the reference voltage will not fully recover from this disturbance, to its original value before the next sample is taken.

FIG. 2 shows the reference voltage source Vref output 30 as well as the respective sampled outputs 32 and 34 of the slower DAC filter A and faster DAC filter B on the same time axis t, for ease in explanation. Each time curve 30, 32 and 34 is, however, shown with a separate voltage amplitude axis. As shown, DAC filter B samples the reference voltage source Vref at each sampling time instant t1, t3, t5, t7, etc. DAC filter A samples the reference voltage source Vref at each sampling time instant t1, t2, t3, t4, etc., at twice the rate of DAC filter B.

The voltage source output 30 is disturbed from its position each time a sample is taken, and thereafter begins to return to its original value. Each time (t1, t3, t5, t7, etc.) the slower DAC filter A takes a sample, the reference voltage output 30 (shown at 61, 65, 69, 73, etc.) is at the same level 40. This is so because the output 30 has enough time to recover to the value 40 before the next sample is taken. Thus, the samples 44, 46, 48, and 50 of the DAC filter A are all equal to the value 40, yielding the flat output response 32.

In contrast, every other time (t1, t3, t5, etc.) the faster DAC B takes a sample, the reference voltage output 30 (shown at 61, 65, 69, etc.) is at a first value 40, and every other time (t2, t4, t6, etc.) the faster DAC B takes a sample, the reference voltage output 30 (shown at 63, 67, 71, etc.) is at a second value 52, lesser than the value 40. This is so because the samples are taken at such a high rate that the output 30 does not have enough time to recover to its immediately preceding sampled value. Thus, the faster DAC samples 54, 58, 62, and 66 are equal to the first value 40 while the samples 56, 60 and 64 are equal to the second value 52, yielding the square wave output response 34. As aforementioned, this results in DAC gain errors as well as inter-modulation of quantization noise.

The problems associated with the prior art systems are solved by a switched-capacitor load circuit according to the present invention. The switched-capacitor load circuit acts to equate the charge loading (sampling) on the reference voltage source by the two DAC switched-capacitor filters. That is, the circuit cooperates with the slower DAC filter to make it appear to the reference voltage source as if the slower DAC filter were taking samples from the reference voltage source at the same rate as the faster DAC filter. The circuit takes a sample (i.e., charge packet) from the reference voltage source at each time instant when the faster DAC filter is taking a sample and the slower DAC filter is not taking a sample. The value of the sample taken by the load circuit is preferably equal that of the sample taken by the slower DAC filter.

Figure 3:
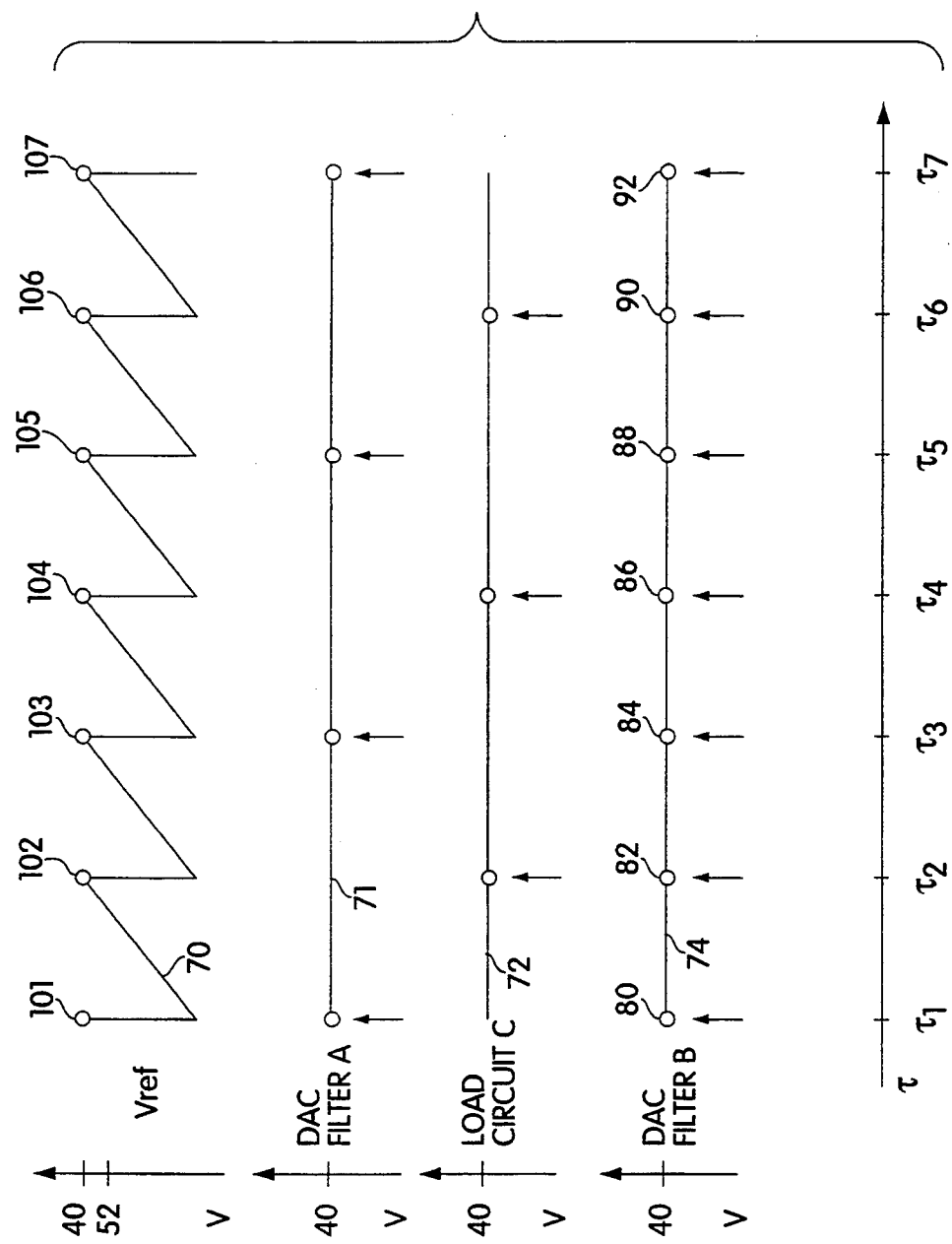
FIG. 3 is a timing diagram of of a synchronous switched-capacitor DAC system according to the present invention.

A timing diagram of the system of the present invention is shown in FIG. 3. Like FIG. 2, the respecitve timing signals 70, 71, 72 and 74 representing the reference voltage, the sampled output of the slow DAC filter A, the sampled output of the load circuit C, and the sampled output of the faster DAC circuit B, are shown on the same time axis t and each on individual voltage amplitude axes. As shown at C, the load circuit takes a sample of the reference voltage source Vref at each time instant (t2, t4, t6, etc.) when the faster DAC filter B is taking a sample and the slower DAC filter A is not taking a sample. Thus, the faster DAC filter B is always taking a sample of the reference voltage when another sample is simultaneously being taken, either by the slower DAC filter A or the load circuit C. This results in the same reference voltage value being sampled at each sampling time instant ti and a corresponding flat output response, as described below.

As shown, at every other sampling time instant (t1, t3, t5, etc.), both the slower DAC filter A and the faster DAC filter B sample the reference voltage source Vref. The reference voltage output 70 at these sampling time instances (shown at 101, 103, 105, 107, etc.) has a value of 40. Additionally, at every other sampling time instant (t2, t4, t6, etc.), both the load circuit C and the faster DAC B sample the reference voltage source Vref. The reference voltage output 70 at these sampling time instances (shown at 102, 104, 106, etc.) also has the same value of 40. Thus, the sampled output values 80, 82, 84, 86, 88, 90, etc. of the faster DAC B are all equal to the value 40, yielding the flat output response 74.

Figure 4:
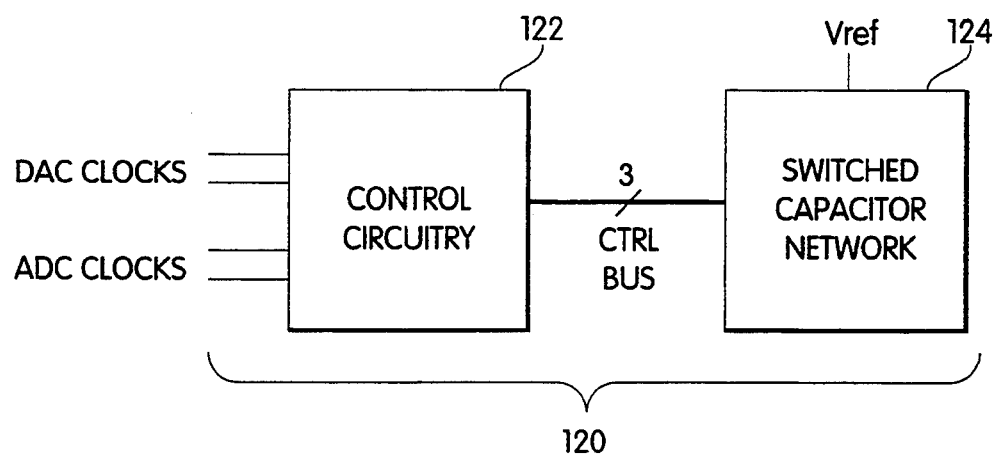
FIG. 4 is a block diagram of a load circuit according to the present invention.

An example load circuit according to the present invention is shown in the block diagram of FIG. 4. As shown, the load circuit 120 includes control circuitry 122 and a switched capacitor load network 124. the control circuitry receives a set of clock signals DAC CLOCKS and ADC CLOCKS and includes digital circuitry for producing, from the clock signals, the control signals in CTRL BUS. The network 124 accepts the control signals in CTRL BUS as well as an input reference voltage source VREF and includes input circuitry for sampling VREF at appropriate sampling time instances as controlled by the signals in CTRL BUS.

Figure 5:
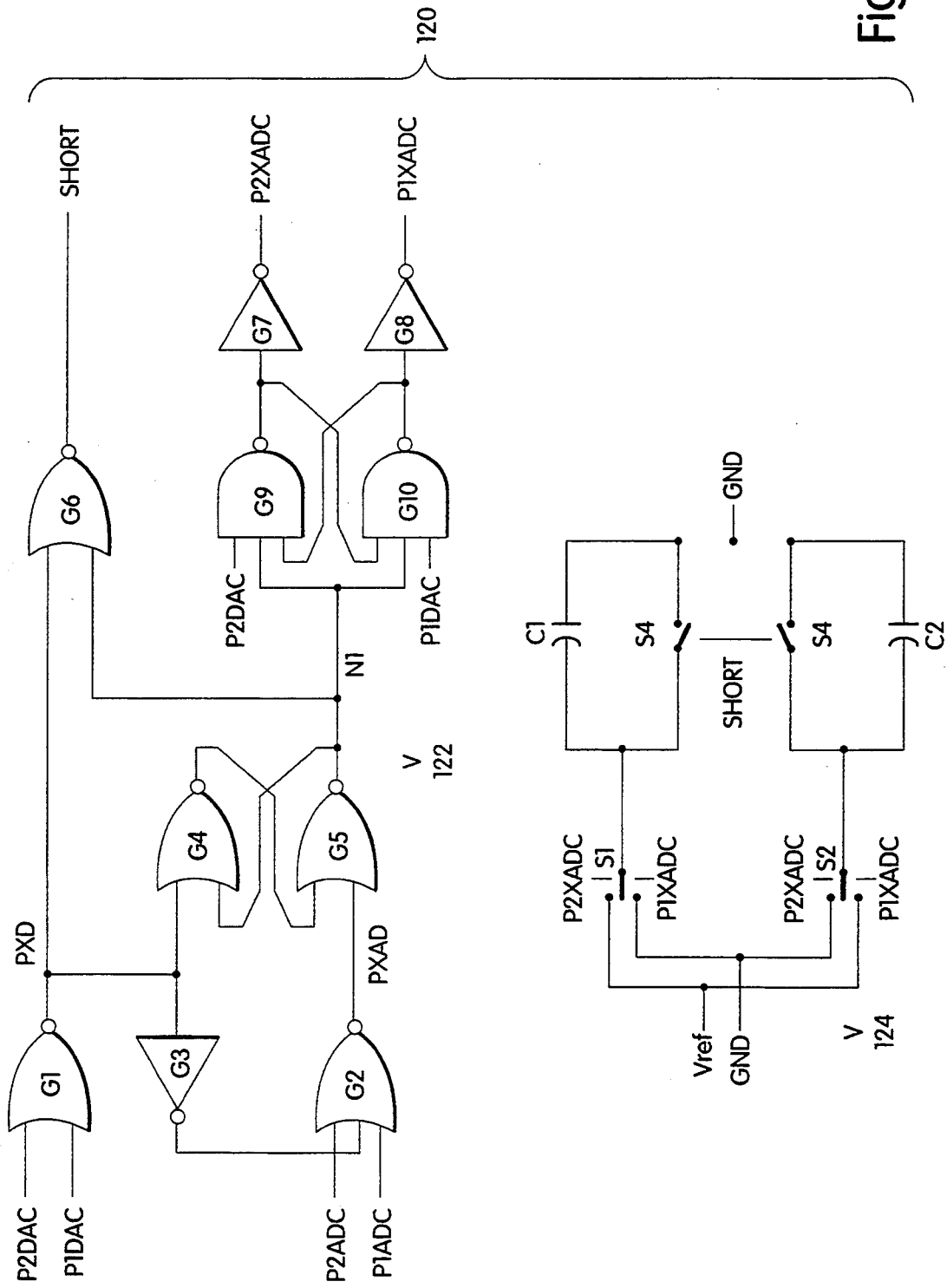
FIG. 5 is a schematic diagram of the load circuit of FIG. 4.

The load circuit 120 including the control circuitry 122 and network 124 is shown in the schematic diagram of FIG. 5. A description of the operation of the circuitry in FIG. 5 makes reference to the timing diagram of FIG. 6 which indicates an example mode of operation. For the purposes of explanation, it is assumed that there is a sigma delta DAC and a sigma delta ADC operating synchronously on the same chip. The DAC rate is eight times the ADC rate and the load circuit will ensure the reference sees a constant load at any sampling instant.

The capacitors C1 and C2 in FIG. 5 are replications of the ADC reference loading capacitors which load the reference in a manner dictated by the control circuitry. They are referred to as C1 and C2 but in reality they comprise a network of capacitors which duplicates the network the ADC presents to the reference. The ADC timing signals are comprised of two non overlapping phases P1ADC and P2ADC and are synchronized to the DAC timing signals which are comprised of two non overlapping phases P1DAC and P2DAC. The DAC timing rate is eight times the ADC timing rate in this example. It should be noted that the ADC timing in this example is intentionally delayed slightly with respect to the DAC timing in order to facilitate the implementation of the control circuitry.

Figure 6:
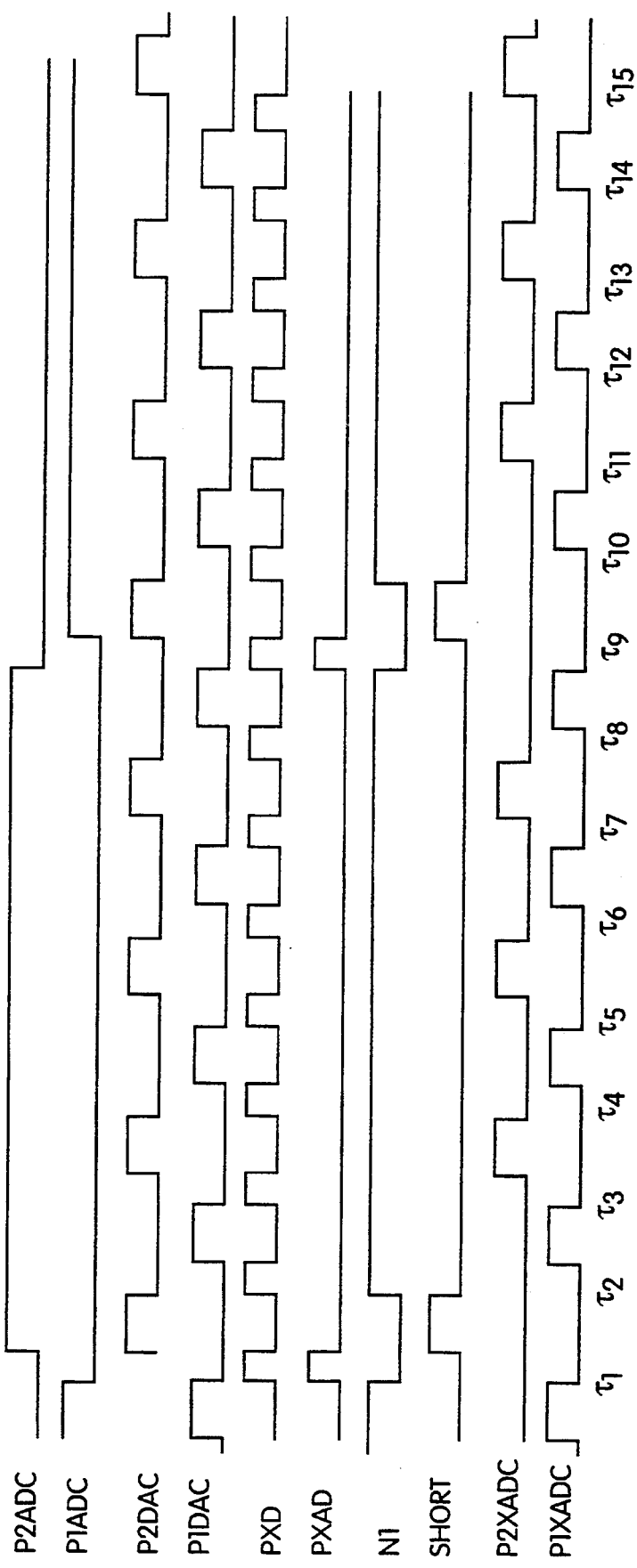
FIG. 6 is a timing diagram of the input and output signals of the load circuit of FIG. 5.

Refer now to both the schematics of FIG. 5 and the timing waveforms of FIG. 6. Note that the DAC rate is eight times the ADC rate.

The DAC loads the reference on every DAC phase (P1DAC and P2DAC) at a high rate (t1, t2, t3, ...) and the ADC loads the reference on every ADC phase (P1ADC and P2ADC) at a low rate (t1, t9, t17, ...). The load circuit will equalize the reference loading by presenting the reference with an equivalent ADC load at those times when the DAC loads the reference but the ADC does not (t2, t3, t4, t5, t6, t7, t8, t10 ...). The signal PXD generated in the control circuitry represents the non overlap period of the DAC clock phases and is shown in the timing diagram. It is combined with two phases of the ADC clock (P1ADC and P2ADC) to produce PXAD which indicates when BOTH the ADC and the DAC are about to start a new phase i.e. when the reference will be presented with its maximum load. PXAD clears the output N1 of the RS flip-flop just prior to the commencement of any ADC clock phase. Subsequent DAC phases set the output N1 of the RS flip-flop via PXD until the next ADC clock phase starts at which time N1 is reset again via PXAD.

N1 is now combined with P1DAC and P2DAC to produce control signals P1XADC and P2XADC which are used to present the dummy load capacitors C1 and C2 at the time points mentioned above (t2, t3, t4, t5, t6, t7, t8, t10 ...).

Gate G6 combines N1 and PXD to produce SHORT which controls S3 and S4. SHORT is generated at times (t1, t9, t17, ...) when the ADC is loading the reference and the loading circuit is not. When SHORT is asserted, the dummy ADC load capacitors C1 and C2 are discharged. At approximately the same time both the ADC and DAC connect their usual capacitors to the reference as a load. The load circuitry driven by P1XADC and P2XADC then correctly loads the reference for all remaining DAC sampling times (t2, t3, t4, t5, t6, t7, t8, t10 ...) within the ADC phase. During P2XADC a discharged C1 is presented to VREF while C2 is discharged to GND and during P1XADC a discharged C2 is presented to VREF while C1 is discharged to GND.

Thus, the present invention provides a load circuit and method which samples the reference voltage source at appropriate times to equate the sampling of the reference voltage source by two switched-capacitor DAC filters operating at different rates. This results in the substantial elimination of DAC gain errors and in-band quantization noise.

As used herein, the term "reference source" is intended to cover a source which produces a reference voltage, a reference current, or a reference charge. While the embodiment described herein relates to a circuit which samples a reference voltage source, which produces a reference voltage, it is to be understood that the circuit of the present invention could be used to sample a reference source which alternatively produces a reference current or charge.

Additionally, while the present invention has been described with respect to a switched-capacitor filter system, the load-equalizing method of the present invention can be used with any circuit that disturbs a reference voltage source at a periodic rate. The method of the invention can be practiced with a wide variety of circuits; there is no particular need to employ the exemplary circuit described in detail herein. Further, while the present invention was described with respect to DACs which operate synchronously, it is envisioned that the load circuit of the present invention could be used with asynchronously operated DACs.

It is contemplated that numerous variations and modifications are possible in light of the above teachings. It is, therefore, to be understood that the foregoing embodiments are presented by way of example only and that, within the scope of the appended claims and equivalents thereto, the invention may be practiced otherwise than as specifically described.

What is claimed is:

1. A DAC system comprising:
    a first DAC connected and operable to sample a reference source, which provides a reference, at a first rate;
    a second DAC connected and operable to sample the reference source at a second rate, the second rate being greater than the first rate; and
    at least one load circuit connected and operable to sample the reference source at a third rate such that the level of the reference provided by the reference source is substantially the same each time a sample is taken.

2. A DAC system as claimed in claim 1 wherein the first and second DACs include first and second switched-capacitor filters, respectively, the first filter sampling the reference source at the first rate and the second filter sampling the reference source at the second rate.

3. A DAC system as claimed in claim 2 wherein the first and second DACs further include first and second sigma-delta DACs, respectivley.

4. A DAC system as claimed in claim 3 wherein the first and second DACs are coupled to a common reference clock and are synchronously operated, and the load circuit samples the reference source when the second DAC is sampling and the first DAC is not sampling.

5. A DAC system as claimed in claim 4 wherein the load circuit includes a network of capacitors and switches coupled to the reference source.

6. A DAC system as claimed in claim 5 wherein the load circuit further includes digital control logic, coupled to the network, to control the sampling by the load circuit.

7. A DAC system as claimed in either one of claims 1 or 6 wherein the second DAC further includes a variable rate interpolator increasing an interpolation ratio thereof upon a decrease in an input sampling frequency.

8. A DAC system comprising:
 a first means for sampling a reference source, which provides a reference, at a first rate;
 a second means for sampling the reference source at a second rate, the second rate being greater than the first rate; and
 at least one circuit load means for sampling the reference source at a third rate such that the reference is at substantially the same level each time a sample is taken.

9. A DAC system as claimed in claim 8 wherein the first and second means for sampling include first and second switched-capacitor filters, respectively, the first filter sampling the reference source at the first rate and the second filter sampling the reference source at the second rate.

10. A DAC system as claimed in claim 9 wherein the first and second means for sampling further include first and second sigma-delta DACs, respectively.

11. A DAC system as claimed in claim 10 wherein the first and second means for filtering are coupled to a common clock source and are synchronously operated, and the at least one circuit load means samples the reference source when the second means for sampling is sampling and the first means for sampling is not sampling.

12. A DAC system as claimed in claim 11 wherein the at least one circuit load means includes a network of capacitors and switches coupled to the reference source.

13. A DAC system as claimed in claim 12 wherein the at least one circuit load means further includes digital control logic, coupled to the network, to control the sampling by the at least one circuit load means.

14. A DAC system as claimed in either of claims 8 or 13 wherein the second means for sampling further includes a variable rate interpolator increasing an interpolation ratio thereof upon a decrease in an input sampling frequency.

15. A method for equating reference source sampling by first and second devices which each periodically sample the reference source, which produces a reference, comprising the steps of:
 with the first device, sampling the reference source at a first rate;
 with the second device, sampling the reference source at a second rate; and
 sampling the reference source at a third rate such that the level of the refence is substantially the same each time a sample is taken.

* * * * *